United States Patent
Fukuda

(10) Patent No.: US 8,081,513 B2
(45) Date of Patent: Dec. 20, 2011

(54) NAND FLASH MEMORY

(75) Inventor: Koichi Fukuda, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 363 days.

(21) Appl. No.: 12/403,750

(22) Filed: Mar. 13, 2009

(65) Prior Publication Data
US 2009/0273978 A1 Nov. 5, 2009

(30) Foreign Application Priority Data
Apr. 30, 2008 (JP) ................. 2008-118515

(51) Int. Cl.
*G11C 11/34* (2006.01)
(52) U.S. Cl. ......... 365/185.17; 365/185.24; 365/185.22; 365/185.29
(58) Field of Classification Search ............. 365/185.17, 365/185.24, 185.29, 185.22
See application file for complete search history.

(56) References Cited

U.S. PATENT DOCUMENTS
| | | |
|---|---|---|
| 5,930,173 A | 7/1999 | Sekiguchi |
| 6,614,693 B1 | 9/2003 | Lee et al. |
| 6,856,552 B2 | 2/2005 | Takahashi |
| 2007/0036001 A1* | 2/2007 | Kanda et al. ............. 365/185.18 |
| 2007/0058433 A1* | 3/2007 | Takeuchi et al. ......... 365/185.17 |
| 2007/0183208 A1* | 8/2007 | Tanaka et al. ............ 365/185.22 |

FOREIGN PATENT DOCUMENTS
JP 2003-173690 6/2003

OTHER PUBLICATIONS

Koichi Fukuda, et al., "Random Telegraph Noise in Flash Memories—Model and Technology Scaling", IEDM Tech. Dig., 2007, pp. 169-172.

U.S. Appl. No. 12/727,817, filed Mar. 19, 2010, Fukuda, et al.

* cited by examiner

*Primary Examiner* — Fernando Hidalgo
(74) *Attorney, Agent, or Firm* — Oblon, Spivak, McClelland, Maier & Neustadt, L.L.P.

(57) ABSTRACT

A NAND flash memory has a control circuit. The control circuit applies a writing voltage between a control gate and a well by applying a first voltage to the well and a positive second voltage higher than the first voltage to the control gate during the writing operation, and then the control circuit applies a detrapping voltage between the control gate and the well by applying a third voltage to the control gate and a positive fourth voltage higher than the third voltage to the well before the verification reading operation.

13 Claims, 12 Drawing Sheets

FIG. 1A PROGRAM PULSE APPLICATION
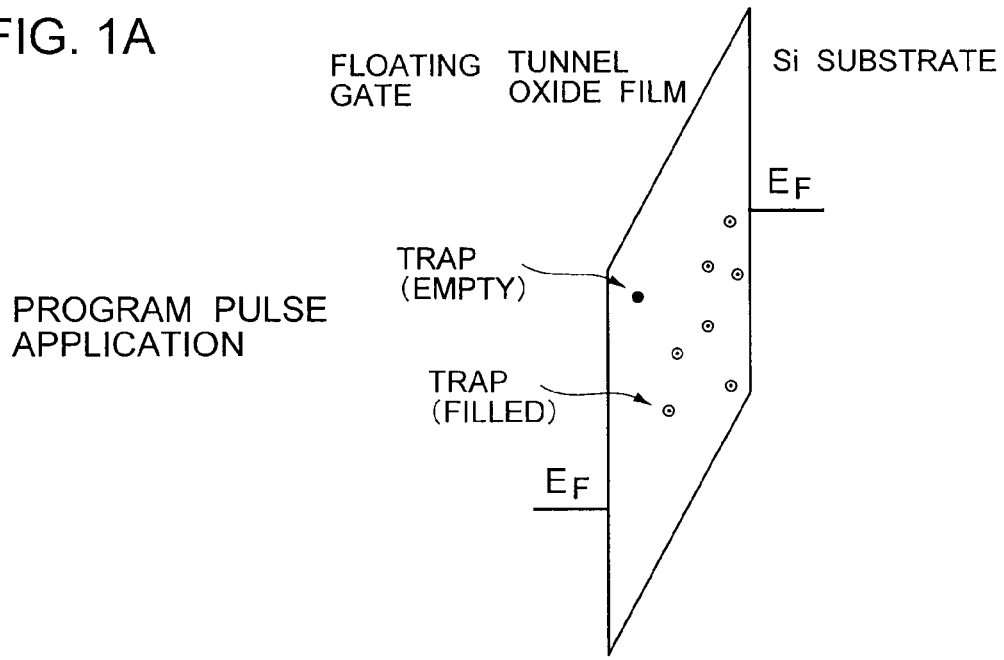
FIG. 1B VERIFICATION READING
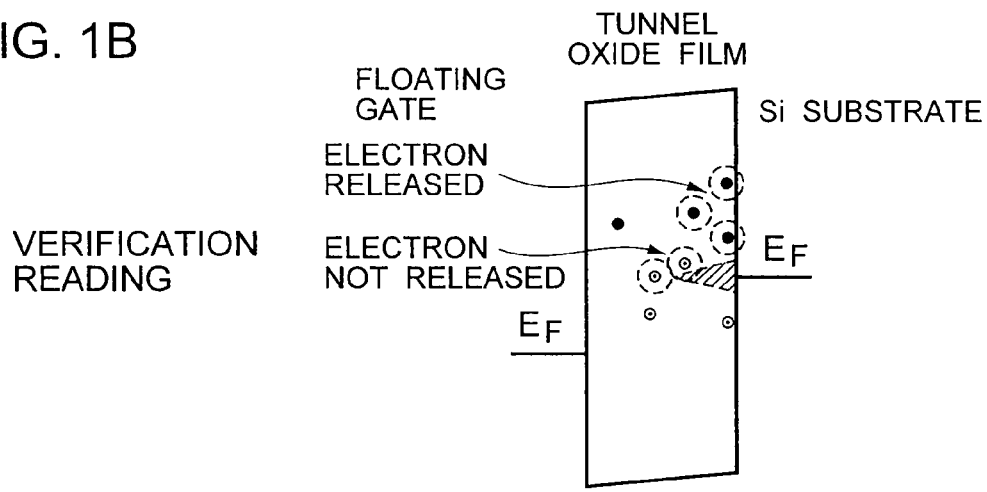
FIG. 1C NORMAL READING
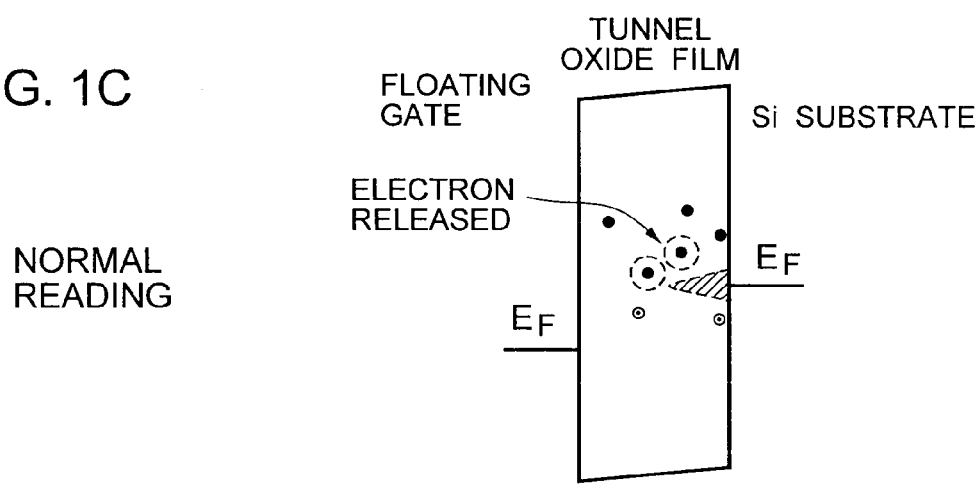

NAND FLASH MEMORY

CROSS-REFERENCE TO RELATED APPLICATION

This application is based upon and claims the benefit of priority from the prior Japanese Patent Application No. 2008-118515, filed on Apr. 30, 2008, the entire contents of which are incorporated herein by reference.

BACKGROUND OF THE INVENTION

1. Field of the Invention

The present invention relates to a NAND flash memory for writing/erasing information by injecting charge into or removing charge from a floating gate or a charge storage layer.

2. Background Art

Nonvolatile semiconductor memories of the prior art include, for example, a floating-gate memory and a silicon-oxide-nitride-oxide-silicon (SONOS) memory (or a metal-oxide-nitride-oxide-silicon (MONOS) memory).

In these nonvolatile semiconductor memories, information (data) is stored by retaining charge (electrons or holes) in floating gates or charge storage layers which are isolated from surrounding parts by insulating films made of $SiO_2$ and the like. A threshold voltage Vt of a memory cell transistor changes with an amount of retained charge and thus the information (data) is identified by sensing the threshold voltage Vt.

Information is written/erased, that is, charge is injected and removed by tunneling current generated by a high electric field from a Si substrate or a control gate, or by a hot carrier from the Si substrate (for example, see Japanese Patent Laid-Open No. 2003-173690).

In any injecting method, charge is repeatedly passed through the insulating film made of $SiO_2$ and the like by repeating writing/erasing of information. When passing through the insulating film, the charge causes damage to the insulating film and generates a number of electron traps and hole traps.

The generated traps lead to various problems.

SUMMARY OF THE INVENTION

According to one aspect of the present invention, there is provided: a NAND flash memory, comprising:

a NAND string made up of a plurality of memory cells connected in series to store information according to a threshold voltage corresponding to an amount of charge retained in a charge retaining layer, the memory cell including: the charge retaining layer which is formed on a well in a surface region of a semiconductor substrate via a first insulating film and is isolated from a surrounding part by a plurality of insulating films including the first insulating film and a second insulating film; and a control gate provided on the charge retaining layer via the second insulating film, and a control circuit that controls operations of the memory cells by controlling voltages applied to the control gates and the well, wherein the control circuit makes charge injected into the charge retaining layer or removed from the charge retaining layer by applying a writing voltage between the control gate and the well during a writing operation, and then the control circuit makes charge having been trapped in the first insulating film provided between the well and the charge retaining layer released, by applying a de-trapping voltage between the control gate and the well before verification reading operation, the de-trapping voltage having a reversed polarity from the writing voltage and an absolute value smaller than an absolute value of the writing voltage.

According to the other aspect of the present invention, there is provided: a NAND flash memory, comprising:

a NAND string made up of a plurality of memory cells connected in series to store information according to a threshold voltage corresponding to an amount of charge retained in a charge retaining layer, the memory cell including: the charge retaining layer which is formed on a well in a surface region of a semiconductor substrate via a first insulating film and is isolated from a surrounding part by a plurality of insulating films including the first insulating film and a second insulating film; and a control gate provided on the charge retaining layer via the second insulating film, and a control circuit that controls operations of the memory cells by controlling voltages applied to the control gates and the well, wherein the control circuit makes charge injected into the charge retaining layer or removed from the charge retaining layer by applying an erasing voltage between the control gate and the well during an erasing operation, and then the control circuit makes charge having been trapped in the first insulating film provided between the well and the charge retaining layer released, by applying the de-trapping voltage between the control gate and the well before the verification reading operation, the de-trapping voltage having a reversed polarity from the erasing voltage and an absolute value smaller than an absolute value of the erasing voltage.

BRIEF DESCRIPTION OF THE DRAWINGS

FIG. 1A is a schematic view showing a band structure near a tunnel oxide film in a state in which a writing pulse is applied to a control gate;

FIG. 1B is a schematic view showing a band structure near the tunnel oxide film during verification reading operation;

FIG. 1C is a schematic view showing a band structure near the tunnel oxide film during normal reading;

DETAILED DESCRIPTION

Figure 2:
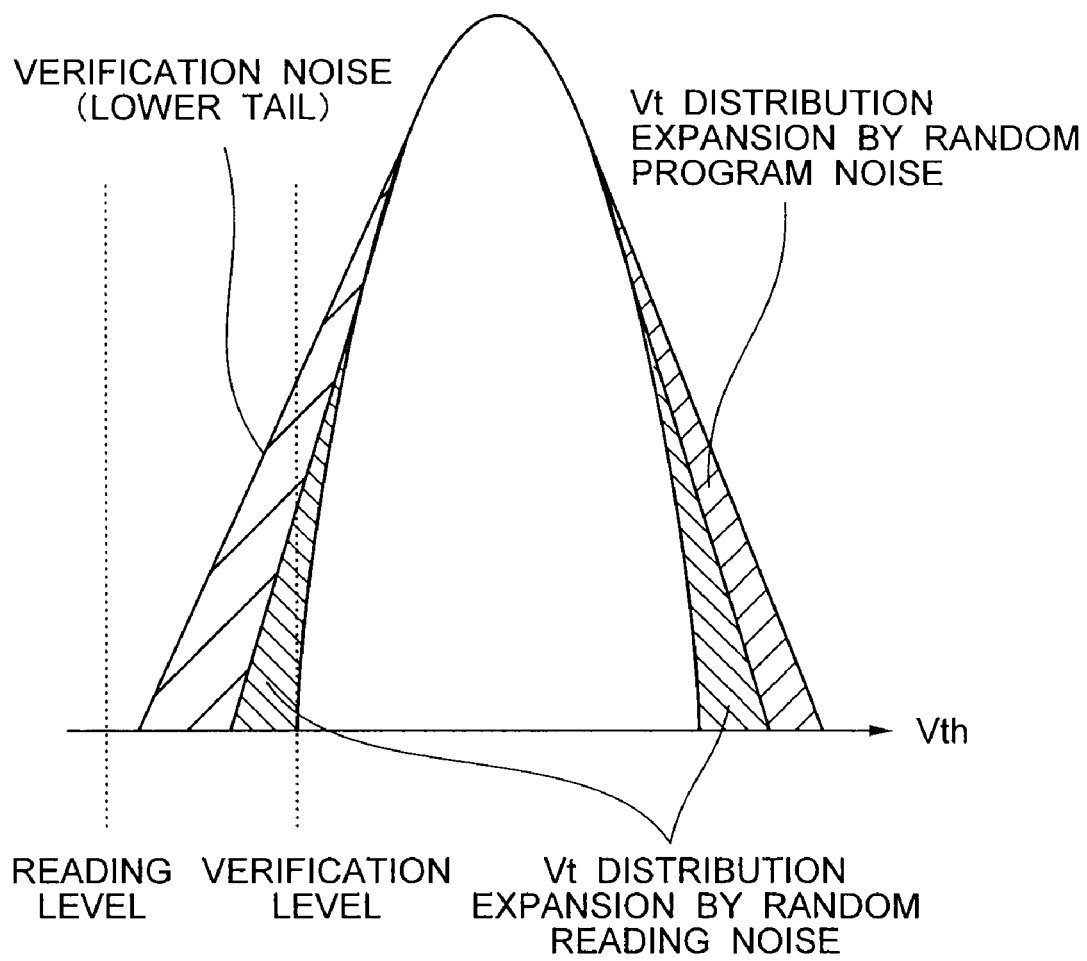
FIG. 2 shows a threshold voltage distribution broadened by noises including verification noise.

The fluctuations in threshold voltage due to a unit charge (elementary charge "e") increases with size-scaling of memory cells. For example, in a floating-gate flash memory of the 20-nm generation, when the number of electrons in a floating gate changes by one, a threshold voltage changes by about 5 mV to 20 mV.

As changes in threshold voltage due to a unit charge increase, the influence of two kinds of random noise, that is, program noise and read noise cannot be negligible.

The program noise is caused by statistical fluctuations in the number of electrons injected into a floating gate or a charge retaining layer by a single program (writing) pulse.

For example, when a threshold voltage is increased by 0.2 V by a signal writing pulse, ten to several tens of electrons on average are injected by the single writing pulse in the 20-nm to 30-nm generations. The number of electrons injected by the single writing pulse is mainly determined based on Poisson's distribution, and thus the dispersion increases as the average number of injected electrons decreases. In other words, the numbers of injected electrons are widely distributed around the average number of injected electrons and the fluctuations in threshold voltage by the single writing pulse are also widely distributed around 0.2 V.

When a writing operation is performed by step-up writing voltage scheme involving verification reading operation, the influence of the program noise is represented as the expanded upper tail of a threshold voltage distribution. Further, smaller memory cells require a smaller number of injected electrons when the threshold voltage is changed by a certain amount, so that the program noise increases.

The read noise is generated by electrons or positive holes which randomly come in and out of electron traps or hole traps existing near the interface of a silicon substrate in the tunnel oxide film of a memory cell.

Fluctuations in threshold voltage depend upon whether electrons or positive holes are trapped or not trapped in an electron trap or a hole trap and the fluctuations vary according to locations having the trap (a position in a channel region and the depth of the tunnel oxide film). Generally, the fluctuations are expressed by formula (1).

$$\Delta V_{th} \approx q/(C_{ox}*W*L) \quad (1)$$

where "q" is an elementary charge, "Cox" is a gate capacitance per unit area, "W" is a channel width, and "L" is a channel length.

Since a NAND flash memory uses a thick tunnel oxide film to obtain data retaining characteristics, "Cox" is small and the threshold voltage considerably fluctuates.

Recent studies have proved that in consideration of percolation caused on a current path by impurity atoms having been doped into a silicon substrate, fluctuations in threshold voltage are much larger than would be expected by formula (1). Further, it is understood that the dependence of scaling is not inversely proportional to W*L of formula (1) but is inversely proportional to $\sqrt{(W*L)}$. Actually, more than 100-mV fluctuations in threshold voltage are observed in a 50-nm generation NAND flash memory.

A threshold voltage fluctuates depending upon whether charge is captured by a trap or not during a reading operation. Thus the influence of read noise is represented as the expanded tails (the upper tail and the lower tail) of a threshold voltage distribution. Since fluctuations in threshold voltage increase in inverse proportion to $\sqrt{(W*L)}$ or $(W*L)$, noise increases with smaller memory cells. It is expected that noise exceeding 300 mV is generated in the 20-nm generation.

Like read noise, verification noise is caused by electron traps or hole traps in the tunnel oxide film of a memory cell. Verification noise is generated when the number of charges captured by electron traps or hole traps varies between when verification reading operation is performed immediately after a writing pulse is applied and when a reading operation is performed after a certain period of time since verification reading operation.

The following will more specifically describe verification noise in, for example, a floating-gate NAND flash memory. FIG. 1A is a schematic view showing a band structure near a tunnel oxide film in a state in which a writing pulse is applied to a control gate. FIG. 1B is a schematic view showing a band structure near the tunnel oxide film during verification reading operation. FIG. 1C is a schematic view showing a band structure near the tunnel oxide film during normal reading. FIG. 2 shows a threshold voltage distribution broadened by noises noise including verification noise.

For example, when a high voltage (10 V to 20 V) is applied to the control gate during a writing operation, a high electric field is generated in the tunnel oxide film between a floating gate and a silicon substrate. The high electric field generates a Fowler-Nordheim (FN) current and electrons are injected into the floating gate. At this point, a number of the electron traps in the tunnel oxide film lie below a Fermi level EF of the silicon substrate and most of the electron traps capture the electrons (FIG. 1A).

After the writing pulse is applied, when a gate voltage is returned to a voltage of about 0 V to a power supply voltage, the Fermi level EF of the silicon substrate decreases and the electron traps, in which the electrons have been captured, start releasing the electrons at the same time.

However, in several μsec to several tens μsec before verification reading operation is performed, not all the electron traps lying lower than the Fermi level EF of the silicon substrate can release the electrons. Thus verification reading operation is performed when some of the electrons are unreleased (FIG. 1B).

If the electrons are kept captured by the electron traps in the tunnel oxide film, the threshold voltage of the memory cell is increased for the same reason as read noise. With the high threshold voltage, it may be determined that the threshold voltage has reached a set level (verification level) at verification reading operation and writing operation may be completed. The electrons are released after a certain period of time, and then the threshold voltage of the memory cell decreases below the set level (FIG. 1C), in this case.

Thus during actual reading operation, the state of the low threshold voltage is read, so that the memory cell has a threshold voltage lower than the set level after the completion of writing operation. In other words, the lower tail of the threshold voltage distribution is expanded (FIG. 2).

As in the case of the read noise, the threshold voltage is changed by an electron or a positive hole captured by a trap, and fluctuations in threshold voltage increase with smaller memory cells. Therefore, verification noise increases with the size-scaling of memory cells and it is expected that noise exceeding 300 mV is generated in the 20-nm generation.

As for the foregoing program noise, it is possible to reduce fluctuations in the number of injected electrons by increasing the writing pulse period. Further, the program noise can be suppressed by increasing a coupling ratio between the control gate and the floating gate to reduce fluctuations in threshold voltage generated by an electron.

While, the influence of the foregoing read noise can be suppressed by increasing a sensing time (observation time) during reading operation to equalize noise, reducing the number of traps in the tunnel oxide film, and suppressing the percolation of the current path by reducing the number of impurity atoms doped in the channel region.

Program noise and read noise are both random noise and the influence thereof can be reduced. However, such noise is basically unavoidable in smaller memory cells.

On the other hand, verification noise occurs when the number of trapped electrons or positive holes in the tunnel oxide film during verification reading operation is larger than in a normal reading operation. Verification noise can be theoretically eliminated by de-trapping charge which has been captured by electron traps or hole traps by a writing pulse and equalizing the number of trapped charges between in a verification reading operation and in a normal reading operation.

In the present invention, verification noise is reduced by equalizing the number of trapped charges between in a verification reading operation and a normal reading operation. It is thus possible to suppress the expansion of the width of a threshold voltage distribution of memory cells.

The following will describe embodiments of the present invention in accordance with the accompanying drawings. The following embodiments will describe a floating-gate NAND flash memory as an example. The present invention is similarly applicable to a SONOS (or MONOS) NAND flash memory.

First Embodiment

Figure 3:
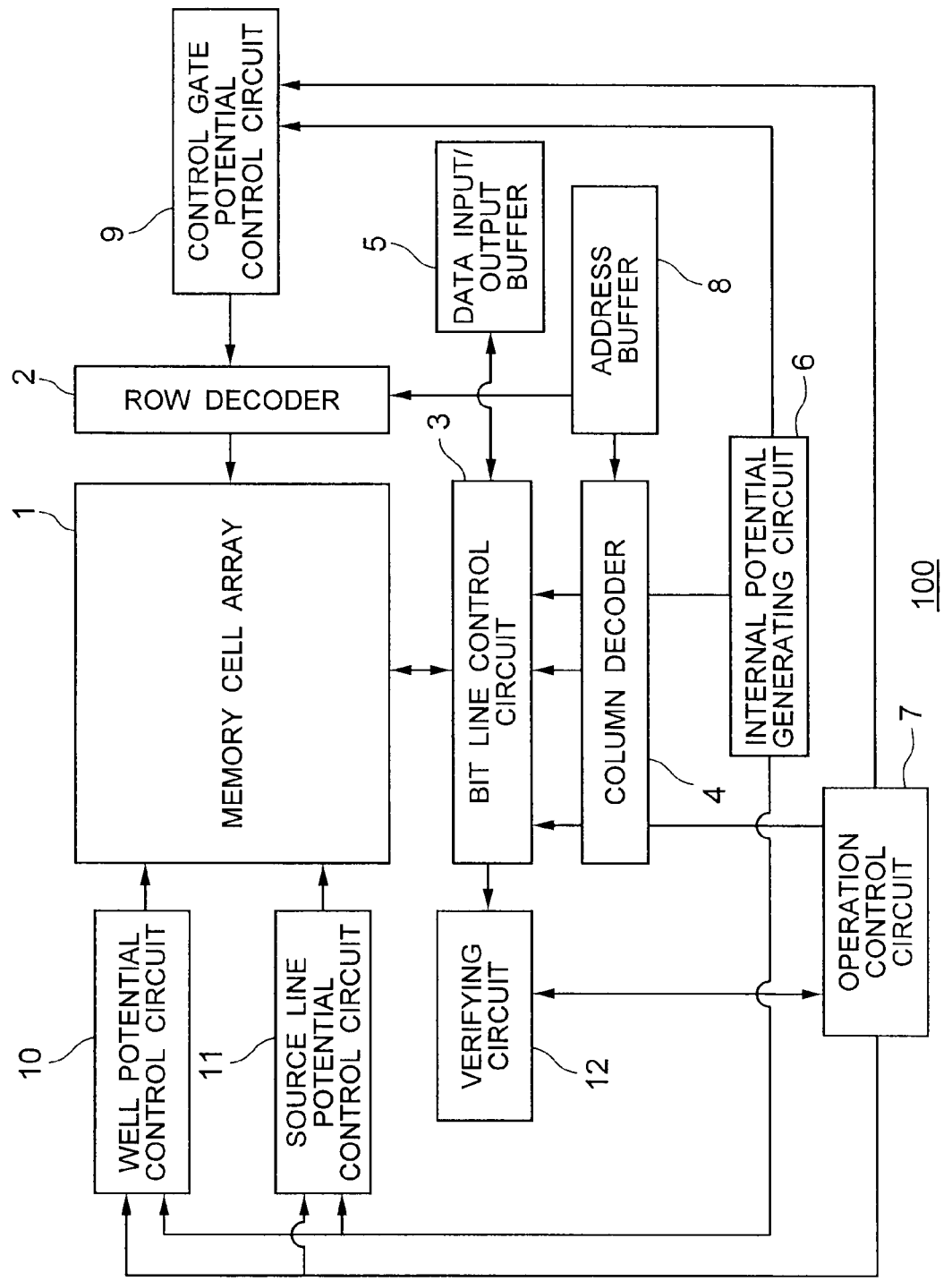
FIG. 3 is a block diagram showing the main configuration of a NAND flash memory 100 according to a first embodiment.
Figure 4A:
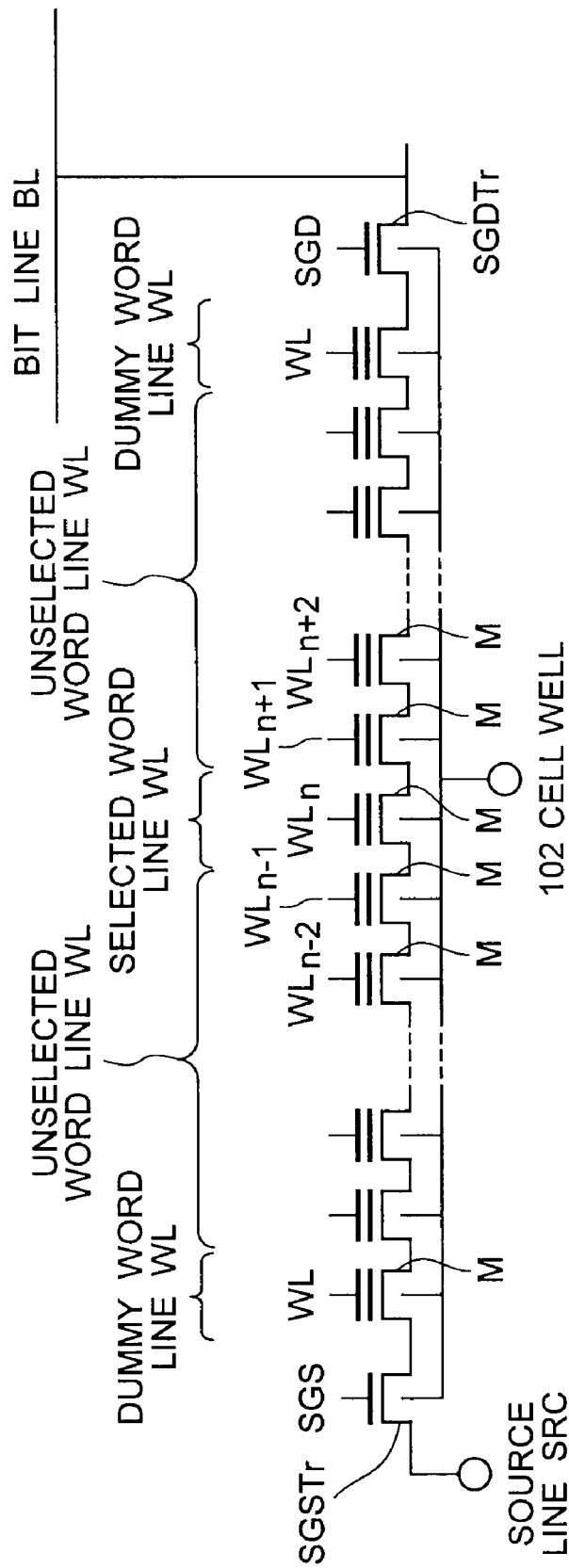
FIG. 4A is a sectional view showing the device structure of a NAND string in the column direction of a memory cell array 1 shown in FIG. 3.
Figure 4B:
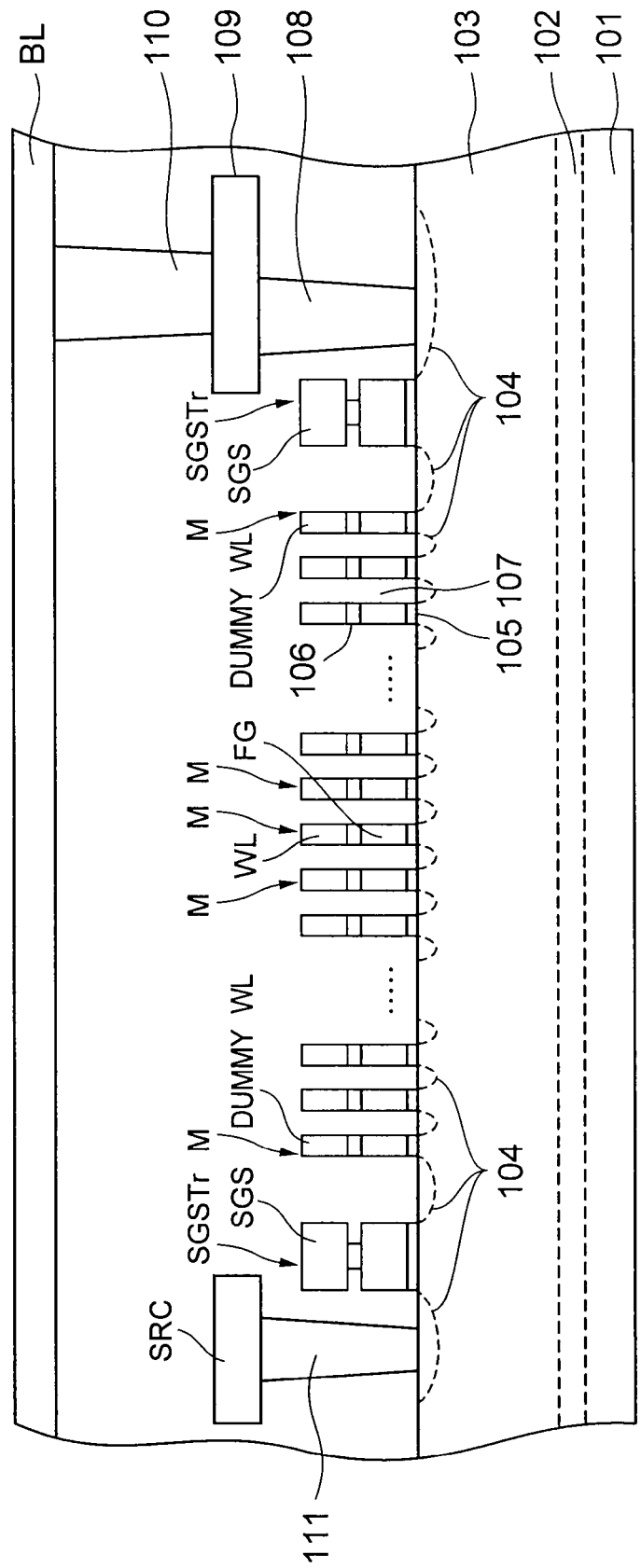
FIG. 4B is a circuit diagram showing the circuit configuration of the NAND string shown in FIG. 4A.

FIG. 3 is a block diagram showing the main configuration of a NAND flash memory 100 according to a first embodiment which is an aspect of the present invention. FIG. 4A is a sectional view showing the device structure of a NAND string in the column direction of a memory cell array 1 shown in FIG. 3. FIG. 4B is a circuit diagram showing the circuit configuration of the NAND string shown in FIG. 4A. The NAND string is made up of a plurality of memory cells M connected in series and two selector gates (SGS transistor and SGD transistor) connected to both ends of the connected memory cells M. The selector gate on the source side is connected to a source line SRC and the selector gate on the drain side is connected to a bit line BL.

As shown in FIG. 3, the NAND flash memory 100 includes the memory cell array 1, a row decoder 2, a bit line control circuit 3, a column decoder 4, a data input/output buffer 5, an internal voltage generating circuit 6, an operation control circuit 7, an address buffer 8, a control gate potential control circuit 9, a well potential control circuit 10, a source potential control circuit 11, and a verifying circuit 12.

The memory cell array 1 has a plurality of NAND strings which are each connected to word lines WL in the row direction and the bit lines BL in the column direction and are arranged in a matrix form.

The row decoder 2 includes a word line driving circuit (not shown), selects and drives the word lines of the memory cell array 1.

The bit line control circuit 3 includes a circuit (not shown) for controlling the potentials of the bit lines BL, a sense amplifier (not shown) for sensing the voltages of the bit lines during verification reading operation and a reading operation, and a data latch (not shown) for storing a reading result or written data and the like. The bit line control circuit 3 controls writing operation and performs verification reading and a reading operation by controlling the potentials of the bit lines BL. The NAND flash memory normally performs a writing operation and a reading operation on each page of 512 bytes to 8 kilobytes. In other words, the bit line control circuit 3 can simultaneously control the bit lines BL corresponding to 512 bytes to 8 kilobytes in a page.

The column decoder 4 selects the bit line control circuit 3 connected to the bit lines of the memory cell array 1.

During reading of data, data read by the bit line control circuit 3 is outputted to an input/output control circuit (not shown) through the data input/output buffer 5.

The internal voltage generating circuit 6 boosts or down-converts a power supply voltage to generate voltages supplied to the bit line control circuit 3, the control gate potential control circuit 9, the well potential control circuit 10, and the source potential control circuit 11.

The control gate potential control circuit 9 controls a voltage applied to a control gate CG of the memory cell M and supplies the voltage to the row decoder 2.

The well potential control circuit 10 controls the potential of a cell well 102 of a semiconductor substrate 101.

The source potential control circuit 11 controls the potential of the source line SRC.

When external control signals such as a chip enable signal CE, a writing enable signal WE, a reading enable signal RE, an address latch enable signal ALE, and a command latch enable signal CLE are inputted to an input pin (not shown) from the outside of a chip and a command code is inputted to an input/output data pin (not shown), the command code is supplied to a command buffer (not shown) via the input/output control circuit (not shown). The command buffer decodes the command code and supplies the command code to the operation control circuit 7 as a command signal.

The operation control circuit 7 performs sequence control on writing, erasure, and reading of data according to an operation mode based on the supplied command signal.

The operation control circuit 7 outputs signals for controlling various operations such as reading, writing, and erasure, so that potentials for the operations are generated by the bit line control circuit 3, the internal voltage generating circuit 6, the control gate potential control circuit 9, the well potential control circuit 10, and the source line potential control circuit 11. Further, the operation control circuit 7 outputs a signal for controlling verification of data, so that the verifying circuit 12 performs verification operation.

The addresses of the memory cells M from the input/output control circuit (not shown) are transferred to the row decoder 2 and the column decoder 4 through the address buffer 8.

The verifying circuit 12 determines whether the threshold voltages of all the predetermined memory cells M have reached a verification level or not (whether the memory cells are written or erased enough or not) in a page to be written or in a block to be erased, based on the sensing result of the bit line control circuit 3 during verification reading operation. Further, the verifying circuit 12 outputs the determination result to the operation control circuit 7. The operation control circuit 7 controls the bit line control circuit 3, the control gate potential control circuit 9, the well potential control circuit 10, and the source line potential control circuit 11 based on the verification result, and continues a writing operation or an erasing operation until the threshold voltages of all the predetermined memory cells M reach (pass) the verification level in the page to be written or in the block to be erased.

Some kinds of the verifying circuit 12 have the function of counting the number of memory cells M (the number of bits) having not reached the verification level or the number of bit lines or columns which are connected to the memory cells M having not reached the verification level. In this case, when the number of memory cells M having not reached the verification level in the page to be written or in the block to be erased or the number of bit lines or columns which are connected to the memory cells M having not reached the verification level is not larger than a predetermined permissible number of bits or bytes, the writing operation or the erasing operation can be discontinued at that moment.

When the number of bits or columns having not reached the verification level is not larger than the permissible number of bits or bytes, this state is called "pseudo pass", whereas when all the bits or columns have reached the verification level, this state is called "pass".

IN the NAND flash memory, an ECC technique is used to correct several to several tens of faulty bits which are caused by various kinds of disturbance or faulty data retaining characteristics and the like. When the number of correctable bits is sufficient, the writing operation or the erasing operation can be discontinued as pseudo pass and some of the memory cells M can be left below the verification level without any problems. Thus it is not necessary to repeat the writing operation or the erasing operation for the memory cell M which needs longer time to be written or erased, thereby improving writing performance or erasing performance.

The following will more specifically describe the configuration of the NAND string. As shown in FIGS. 4A and 4B, a cell well 103 of a p-type semiconductor is formed on the p-type semiconductor substrate 101 so as to be surrounded by the well 102 of an n-type semiconductor. On the cell well 103, a diffusion layer 104 of an n-type semiconductor is formed. The memory cells M are each made up of a source and a drain terminals made up the diffusion layer 104, a floating gate FG which is a charge retaining layer provided on a channel region between the source and the drain terminals via a tunnel oxide film 105, and a control gate CG which is provided as a word line WL on the floating gate FG via an insulating film 106. The insulating film 106 preferably has a high dielectric constant. Generally, as the insulating film 106, a film having a laminated structure of a Si oxide film and a Si nitride film is used.

The floating gate FG is isolated from a surrounding part by the tunnel oxide film 105, the insulating film 106, and an interlayer film 107. When the NAND flash memory is a SONOS (or MONOS) type flash memory, the charge retaining layer is not the floating gate FG but is a charge storage layer made up of a Si nitride film and so on.

Figure 4C:
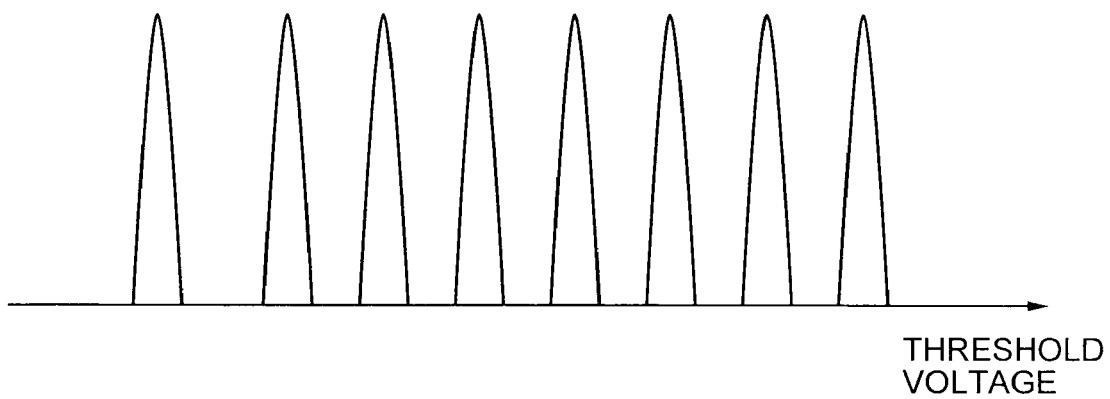
FIG. 4C is a figure showing a threshold voltage distribution.

The memory cell M can store different states of bit information according to threshold voltages corresponding to amounts of charge retained in the floating gate FG. FIG. 4C shows a threshold voltage distribution. For example, as shown in FIG. 4C, when the threshold voltages are controlled in eight states, three-bit information can be stored in each of the memory cells M. The bit information stored in the memory cell M can be read by applying a selected-WL reading voltage to the selected word line WL (control gate CG) and an unselected-WL reading voltage to the unselected word line (control gate CG).

In the cell well 103, a selector gate transistor SGDTr and a selector gate transistor SGSTr are also formed.

The selector gate transistor SGDTr is made up a source and a drain terminals made up of the diffusion layer 104, and a selector gate line SGD having an electrically connected two-layer gate structure. The drain terminal of the selector gate transistor SGDTr is connected to the bit line BL via a contact electrode 108, a metal wiring layer 109, and an interlayer electrode 110. The selector gate transistor SGDTr is controlled by applying a voltage to the selector gate line SGD from the row decoder 2.

The selector gate transistor SGSTr is made up of a source and a drain terminals made up of the diffusion layer 104, and a selector gate line SGS having an electrically connected two-layer gate structure. The source of the selector gate transistor SGSTr is connected to the source line SRC via a contact electrode 111. The selector gate transistor SGSTr is controlled by applying a voltage to the selector gate line SGS from the row decoder 2.

Between the drain terminal of the selector gate transistor SGSTr on the source side and the source terminal of the selector gate transistor SGDTr on the drain side, the plurality of memory cells M are connected in series via the shared sources and drains terminals. The NAND string is formed by the selector gate transistor SGSTr on the source line side, the plurality of memory cells M connected in series, and the selector gate transistor SGDTr on the drain side, three of them are connected in series.

In the present embodiment, the memory cells M adjacent to the selector gate transistors SGSTr and SGDTr are set as dummy cells for preventing erroneous writing. During a writing operation, a voltage applied to the word lines WL of the dummy cells is lower than a voltage applied to the other selected and unselected word lines WL.

As described above, the control circuits 3, 9, 10, 11, and 7 control voltages applied to the control gates CG (word lines), the cell well, the source line, and the bit lines to control the operations of the memory cells M.

The following will describe the writing operation of the NAND flash memory 100 configured thus. The NAND flash memory uses a step-up writing voltage scheme in which the application of a writing pulse and verification reading are repeated while a voltage of the writing pulse Vpgm is gradually increased until the memory cells to be written is written to a desired threshold voltage level.

Figure 5A:
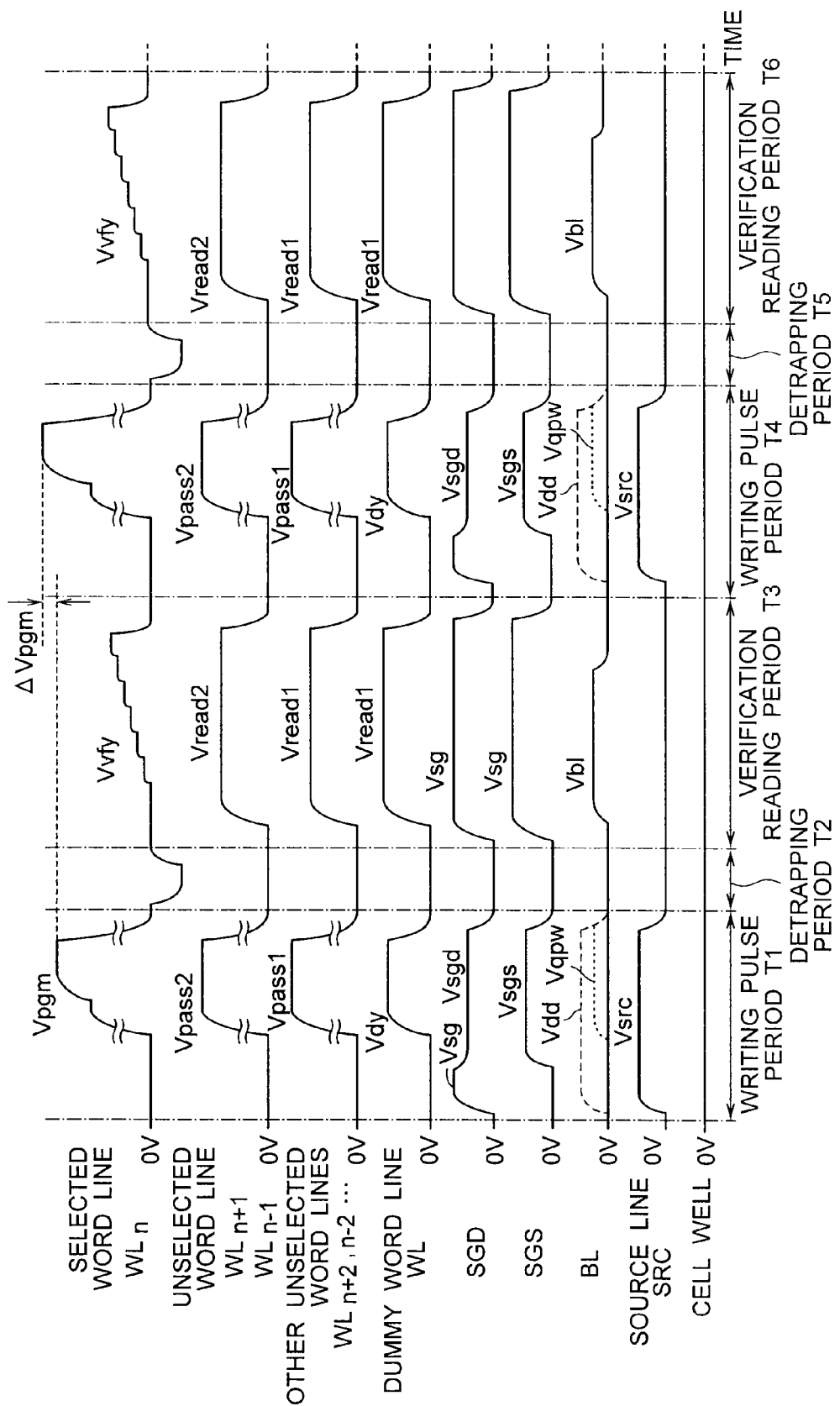
FIG. 5A shows the voltage waveforms of the word lines, the bit line, the selector gate lines, the source line, and the cell well during the writing operation of the NAND flash memory 100 according to the first embodiment.

FIG. 5A shows the voltage waveforms of the word lines, the bit line, the selector gate lines, the source line, and the cell well during the writing operation of the NAND flash memory 100 according to the first embodiment. For simplification, FIG. 5A only shows two repetitions of the application of the writing pulse and verification reading operation in step-up writing voltage scheme.

As shown in FIG. 5A, first, in a writing pulse period T1, the bit line control circuit 3 applies 0 V to the bit lines BL connected to the memory cells M to be written in a page and applies Vdd (about 1 V to 3 V) to the bit lines BL connected to the memory cells M not to be written (that is, the memory cells M where writing is inhibited). Further, Vsrc (about 1 V to 3 V) is applied to the source line SRC. At this point, a voltage of 4 V to 5 V is applied to the selector gate line SGD on the drain side in order to transfer Vdd to the NAND string having the memory cells M where writing is inhibited.

After that, the control gate potential control circuit 9 and the row decoder 2 set the selector gate lines SGD and SGS respectively at intermediate potentials Vsgd and Vsgs between 0 V and Vdd. Next, the control gate potential control circuit 9 and the row decoder 2 apply the writing voltage Vpgm (e.g., about 10 V to 25 V) to the selected word line WLn, an unselected word line voltage Vpass1 (e.g., about 5 V to 10 V) to the unselected word lines WLn+1 and WLn−1 adjacent to the selected word line WLn, and an unselected word line voltage Vpass2 (e.g., about 5 V to 10 V) to the other unselected word lines WLn+2, WLn−2, and so on.

Thus in the memory cells M to be written, the writing voltage Vpgm is applied to the control gates CG and 0 V is applied to channels via the bit lines BL, so that electrons are injected from the channels to the floating gates FG by a Fowler-Nordheim tunneling current caused by a high electric field. In other words, a writing operation is performed.

On the other hand, in the memory cells M where writing is inhibited, the selector gate transistors SGSTr and SGDTr are both turned off, so that the channels in the NAND string are brought into a floating state. Since the unselected word line voltages Vpass1 and Vpass2 are applied to the unselected word lines and the writing voltage Vpgm is applied to the selected word line, the potentials of the channels in the floating NAND string are boosted to about 4 V to 7 V. Thus in the memory cells where writing is inhibited, the writing voltage Vpgm is applied to the control gates CG but electrons are not injected into the floating gates by the Fowler-Nordheim tunneling current because the electric field is insufficient. In other words, the writing operation is not performed.

The unselected word line voltage Vpass1 and the unselected word line voltage Vpass2 may be equal to each other or may be set at different voltages if necessary. In NAND flash memories having small size in the 40-nm or subsequent generations, capacitive coupling between the floating gate of the memory cell M to be written and the control gate CG of the adjacent memory cell M cannot be negligible, and the voltage Vpass1 applied to the unselected word line adjacent to the selected word line is set higher than the unselected word line voltage Vpass2, thereby assisting writing on the selected word lines.

The dummy word lines WL are fed with 0 V and an intermediate voltage Vdy of the unselected word line voltage Vpass2. Thus it is possible to suppress erroneous writing on the memory cells M on the ends of the NAND string. The erroneous writing is caused by gate induced leakage current (GIDL) generated on the ends of the channel in the boosted NAND string.

As described above, in the writing pulse period T1, the bit lines BL connected to the memory cells M to be written are fed with 0 V by the bit line control circuit 3. When a writing scheme called quick pass write scheme is used, Vqpw (e.g., about 1 V) is applied to the bit lines BL connected to the memory cells M to be written with threshold values exceeding a quick-pass write verification level slightly lower than the verification level. Thus writing can be suppressed after the threshold values exceed the quick-pass write verification level, thereby achieving a tighter threshold distribution.

In this way, the control circuits 3, 9, 10, 11, and 7 control voltages applied to the control gates CG (word lines), the cell well, the source line, and the bit lines during the writing operation to perform the writing operation only on the memory cells M to be written in the page.

By applying the writing voltage Vpgm during the writing pulse period T1, electrons are captured by a large number of electron traps which exist in the tunnel oxide film (an oxide film or a nitride oxide film between the cell well and the floating gate FG) of the memory cell M. After the writing pulse period T1 is completed and the application of the writing voltage Vpgm is stopped, electron detrapping takes place from the electron traps, in which charge has been captured, according to each time constant of the traps. Since some traps have longer time constants, many of the traps cannot release electrons in several μsec to several msec.

Next, in a detrapping period T2, the source potential control circuit 11 and the well potential control circuit 10 keep the source line SRC and the cell well at 0 V. In this state, the control gate potential control circuit 9 and the row decoder 2 apply a negative voltage Vdtp (e.g., about −2 V to −10 V) to the selected word line WLn and 0 V to the unselected word lines. The bit lines are fed with 0 V or are brought into a floating state by the bit line control circuit 3.

In other words, the control circuits 3, 9, 10, 11, and 7 apply a third voltage (0 V) to the cell well and apply a negative fourth voltage (Vdtp) lower than the third voltage to the control gates CG before verification reading operation, so that the detrapping voltage Vdtp which has a reversed polarity from the writing voltage and has an absolute value smaller than the writing voltage Vpgm is applied between the control gates CG and the cell well.

Thus it is possible to accelerate detrapping of electrons having been captured by the electron traps in the tunnel oxide film during the writing pulse period T1, and to reduce the number of electrons captured by the electron traps in the tunnel oxide film when verification reading operation is performed in the subsequent verification reading period T3. In other words, the number of electrons captured by the electron traps in the tunnel oxide film during verification reading operation can be close to the number of electrons captured by the traps in the same steady state as in a normal reading operation which is performed when electrons are released (detrapped) after a sufficient lapse of time since a writing operation.

In order to prevent the floating gates FG from being discharged, the absolute value of the detrapping voltage Vdtp is set sufficiently lower than an erasing voltage applied between the control gate CG and the cell well during an erasing operation. Further, in order to prevent excessive disturbance on the unselected memory cells M in the NAND string, it is preferable to apply the same voltage (0 V in the present embodiment) as the potential of the cell well to the unselected word lines during the detrapping period T2.

Next, verification reading operation is performed in the verification reading period T3. The source potential control circuit 11 and the well potential control circuit 10 keep the source line SRC and the cell well at 0 V during the verification reading period T3. First, the control gate potential control circuit 9 and the row decoder 2 apply a voltage Vsg (e.g., 4 V to 5 V) for turning on the selector gate transistors SGSTr and SGDTr, to the selector gate lines SGS and SGD.

Next, the control gate potential control circuit 9 and the row decoder 2 apply a reading voltage Vread2 to the unselected word lines WLn+1 and WLn−1 adjacent to the selected word line WLn and a reading voltage Vread1 to the unselected word lines WLn+2, WLn−2, and so on. Thus the memory cells M connected to the unselected word lines are all sufficiently turned on. The selected word line WLn is fed with a verification level Vvfy.

The reading voltage Vread1 and the reading voltage Vread2 are normally set at the same potential. In NAND flash memories having smaller size in the 40-nm or subsequent generations where capacitive coupling between the selected cell word line and the floating gate of the adjacent memory cells is noticeable, the reading voltages Vread1 and Vread2 may be different to compensate for a reduction in the current drivability of the adjacent cells.

After that, in the verification reading period T3, the bit line control circuit 3 applies a voltage Vbl (e.g., about 0.5 V) for reading, a current passing through the memory cell M is then sensed by a sensing circuit included in the bit line control circuit 3, and it is determined whether the threshold voltage of the memory cell M to be verified is higher or lower than the verification level Vvfy.

In the present embodiment, it is assumed that three bits (octal) are stored in a single memory cell. In this case, the verification level Vvfy is changed seven times to repeat a sensing operation.

In this way, the bit line control circuit 3 senses whether the threshold voltage of the memory cell M connected to the selected word line WLn is higher or lower than the verification level Vvfy, and data corresponding to the sensing result is latched by a latch circuit included in the bit line control circuit 3. After that, based on the latched data, the verifying circuit 12 verifies whether the threshold voltages of all the memory cells to be written in a page or whether all the memory cells other than the predetermined permissible number of bits or bytes have reached the verification level or not (whether the memory cells are written enough or not). In other words, the verifying circuit 12 verifies whether writing verification is passed or not.

As described above, the electrons having been captured by the electron traps in the tunnel oxide film are detrapped during the detrapping period T2. Thus the number of electrons being captured by the traps when a verification reading operation is performed approaches the number of trapped electrons in a steady state when a normal reading operation is performed. It is therefore possible to increase the number of memory cells where verification reading operation and normal reading operation can be performed at the same threshold voltage, and reduce the number of memory cells where verification reading operation and normal reading operation are performed at different threshold voltages. In other words, it is possible to reduce the foregoing verification noise caused by verification reading operation and normal reading operation performed at different threshold voltages.

After that, when the verifying circuit 12 does not determine that writing verification is passed, the writing voltage Vpgm is increased by ΔVpgm and the same operations as in the periods T1 to T3 are repeated. When writing verification is not passed after a predetermined number of repetitions, writing is regarded as being no good and the writing operation on the corresponding page is completed.

When writing verification is passed, writing is regarded as being passed and the writing operation on the corresponding page is completed.

As described above, after the writing pulse is applied, the NAND flash memory of the present embodiment applies a voltage pulse having a different polarity from a writing pulse not causing erasure before verification reading.

Thus the number of electrons being trapped when a verification reading operation is performed can be close to the number of trapped electrons in a steady state when a normal reading operation is performed, so that verification noise is reduced. It is therefore possible to suppress an increase in the width of the threshold voltage distribution of the memory cell, the width being increased by verification noise.

The following will describe the reading operation of the NAND flash memory 100.

Figure 5B:
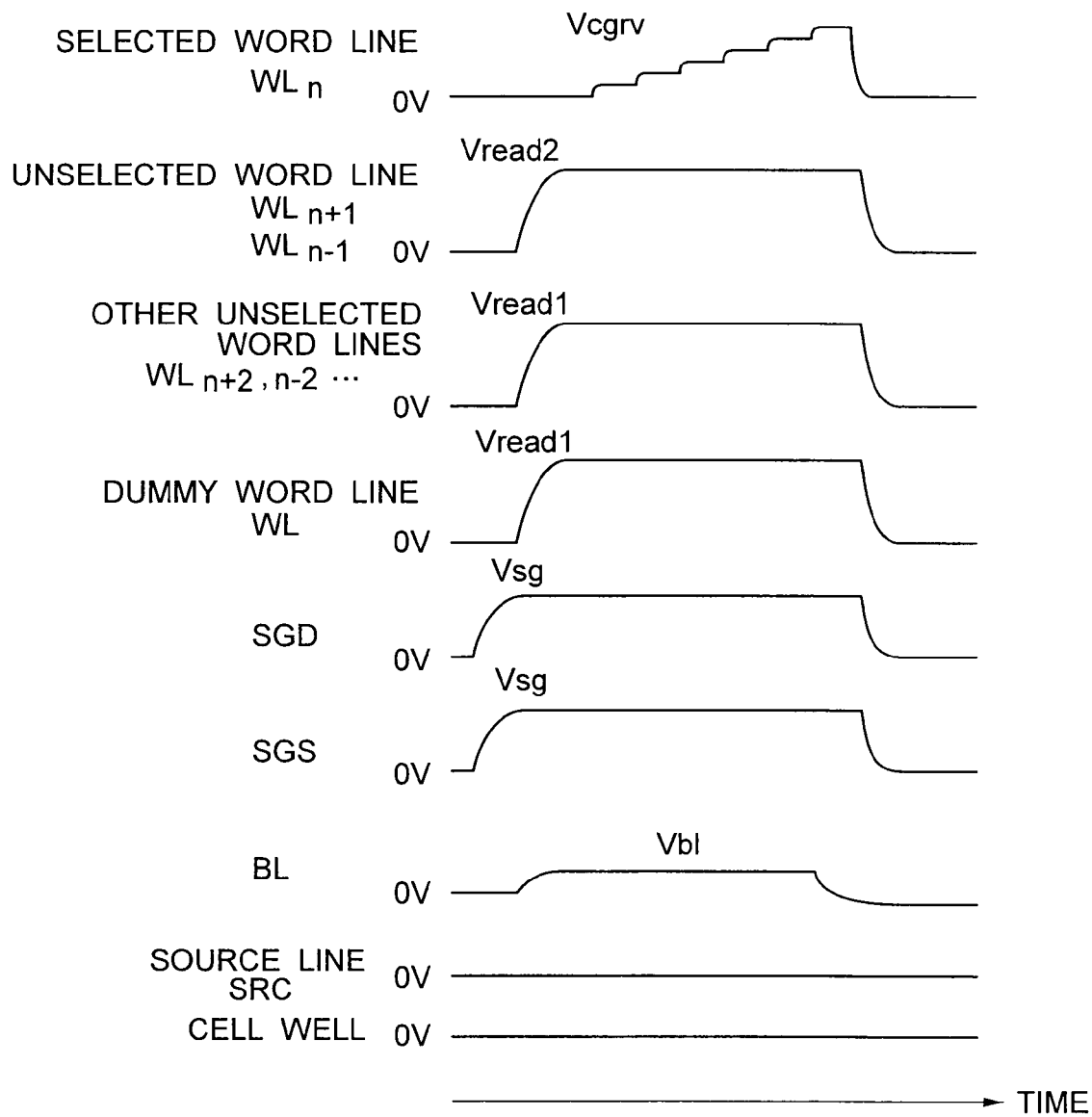
FIG. 5B shows the voltage waveforms of the word lines, the bit line, the selector gate lines, the source line, and cell well during the reading operation of the NAND flash memory 100 according to the first embodiment.

FIG. 5B shows the voltage waveforms of the word lines, the bit line, the selector gate lines, the source line, and cell well during the reading operation of the NAND flash memory 100 according to the first embodiment.

As shown in FIG. 5B, the waveforms during the reading operation are similar to the waveforms of the verification reading period T3 shown in FIG. 5A, and detailed operations performed in the reading operation are similar to detailed operations performed in verification reading operation. In the present embodiment, the voltage of the selected word line is changed to a reference level Vcgrv sequentially changing in seven steps from the lowest voltage. The reference level Vcgrv may not sequentially change from the lowest voltage.

As described above, the NAND flash memory of the present embodiment can suppress an increase in the width of the threshold voltage distribution of the memory cell, the width being increased by verification noise.

In a floating-gate NAND flash memory, verification noise is generally caused by electron traps in a tunnel oxide film and thus the electron traps were illustrated in the present embodiment. However, the kind of traps is not limited to electron traps. Also for verification noise caused by hole traps, the present embodiment can achieve the same effect.

Second Embodiment

The first embodiment particularly described the case where a negative voltage is applied to the selector gate line (control gate) to accelerate detrapping of charge having been captured by the traps in the tunnel oxide film of the memory cell.

Generally, a NAND flash memory does not use a negative voltage which requires well separaton and increases a circuit area. However, by increasing the potential of a well where memory cells are formed, it is possible to have substantially the same condition as the application of a negative voltage to a selected word line.

The present embodiment will particularly describe a method for increasing the potential of a well where memory cells are formed, in order to accelerate detrapping of charge having been captured by the traps in the tunnel oxide film.

The method of the second embodiment is implemented by, for example, the NAND flash memory 100 of FIG. 1 as in the first embodiment. Further, the reading operation of the NAND flash memory 100 is similar to the reading operation of the first embodiment.

Figure 6:
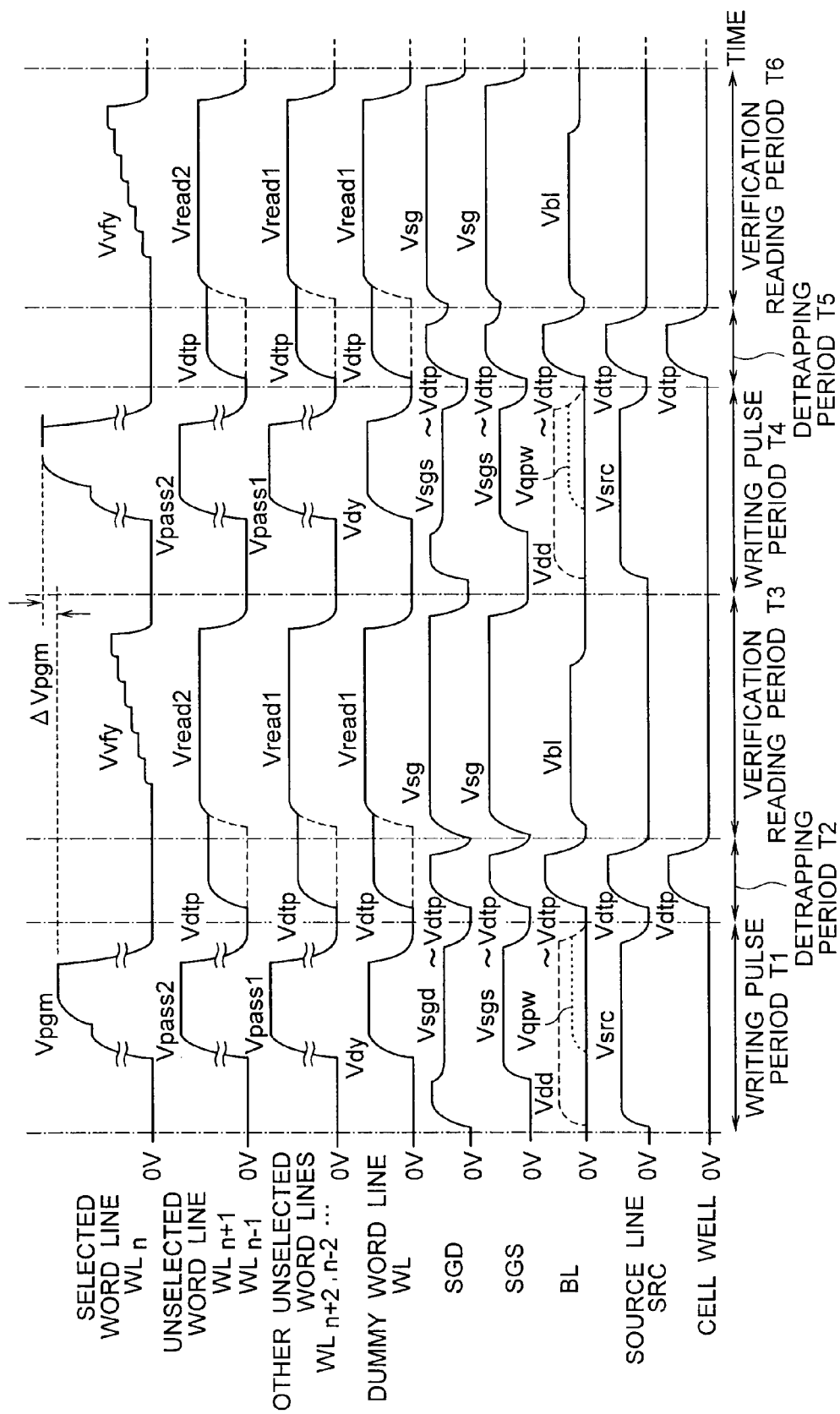
FIG. 6 is a figure showing the voltage waveforms of word lines, a bit line, selector gate lines, a source line, and a cell well during the writing operation of the NAND flash memory 100 according to the second embodiment.

FIG. 6 shows the voltage waveforms of word lines, a bit line, selector gate lines, a source line, and a cell well during the writing operation of the NAND flash memory 100 according to the second embodiment. For simplification, FIG. 6 only shows two repetitions of the application of a writing pulse and verification reading operation in step-up writing voltage scheme.

The writing operation (voltage waveforms) of the second embodiment shown in FIG. 6 is different in detrapping periods T2 and T5 from the writing operation of the first embodiment shown in FIG. 5A. Operations (voltage waveforms) in the other periods (T1, T3, T4, and T6) are similar to the operations of the first embodiment.

As shown in FIG. 6, in the detrapping period T2 following the writing pulse period T1, a source potential control circuit 11 and a well potential control circuit 10 increase the potentials of a source line SRC and the cell well to a voltage Vdtp (e.g., about 2 V to 10 V) set low enough so as not to cause erasure.

At this point, the bit lines and the selector gate lines SGD and SGS are brought into a floating state. The bit lines are charged to a potential as high as the voltage Vdtp of the cell well through a diffusion layer 104 in the cell well, a contact electrode 108, a metal wiring layer 109, and an interlayer electrode 110. The potentials of the selector gate lines SGD and SGS are increased close to Vdtp by capacitive coupling with the cell well. Thus it is possible to prevent a high voltage from causing a breakdown on the gate oxide films of the selector gate transistors SGDTr and SGSTr.

In this state, a control gate potential control circuit 9 and a row decoder 2 apply 0 V only to a selected word line WLn and apply the voltage Vdtp to unselected word lines WLn+1, WLn−1, WLn+2, WLn−2, . . . , and dummy word lines WL.

In other words, the control circuits 3, 9, 10, 11 and 7 apply a third voltage (0 V) to control gates CG and apply the positive fourth voltage Vdtp higher than the third voltage to the cell well before verification reading operation, so that in a selected memory cell connected to the selected word line, the voltage Vdtp having a reversed polarity from a writing voltage Vpgm can be applied between the control gates and the cell well. In memory cells connected to the other word lines, the control gates and the cell well are equal in potential, causing no disturbance changing a threshold voltage.

In the present embodiment, the voltage Vdtp is applied to the word lines other than the selected word line. A voltage somewhat different from Vdtp may be applied instead as long as no disturbance occurs in the memory cells, or 0 V may be applied as in the selected word line. Further, as shown in FIG. 6, the cell well and the source line SRC are set at the same potential in the present embodiment. The potential of the source line SRC may be set somewhat higher than the potential of the cell well. As described above, the source line SRC is connected to the cell well via an n+ diffusion layer 104 in the cell well and thus it is necessary to avoid the application of a voltage lower than the voltage of the cell well having a forward bias junction.

After that, as in the first embodiment, verification reading operation is performed in the verification reading periods T3 and T6.

As described above, after a writing pulse is applied in the writing pulse period, in the detrapping period before verification reading operation is performed in the verification reading period, the voltage which has a reversed polarity from the writing voltage Vpgm and is set low enough so as not to cause erasure is applied between the cell well and the control gate of the memory cell to be written. Thus in the writing pulse period, it is possible to accelerate detrapping of electrons having been captured by the electron traps in the tunnel oxide film by the writing voltage Vpgm. As a result, the number of electrons having been captured by traps in the verification reading period following the detrapping period can be close to the number of trapped electrons in a steady state when a normal reading operation is performed.

Thus it is possible to increase the number of memory cells where verification reading operation and normal reading operation can be performed at the same threshold voltage and reduce the number of memory cells where verification reading operation and normal reading operation are performed at different threshold voltages. In other words, it is possible to reduce the foregoing verification noise caused by performing verification reading operation and normal reading operation at different threshold voltages. That is to say, it is possible to suppress an increase in the width of the threshold voltage distribution of the memory cell, the width being increased by verification noise.

As described above, the NAND flash memory of the present embodiment can suppress an increase in the width of the threshold voltage distribution of the memory cell.

In a floating-gate NAND flash memory, verification noise is generally caused by electron traps in a tunnel oxide film and thus the electron traps were illustrated in the present embodiment. However, the kind of traps is not limited to electron traps. Also for verification noise caused by hole traps, the present embodiment can achieve the same effect.

Third Embodiment

A third embodiment will describe the case where the present invention is applied to a NAND flash memory in which two or more threshold voltage distributions including an erasure distribution are formed also in a negative threshold voltage region and negative threshold voltages are read (negative reading).

The method of the third embodiment is implemented by, for example, the NAND flash memory 100 of FIG. 1 as in the first embodiment.

Figure 7A:
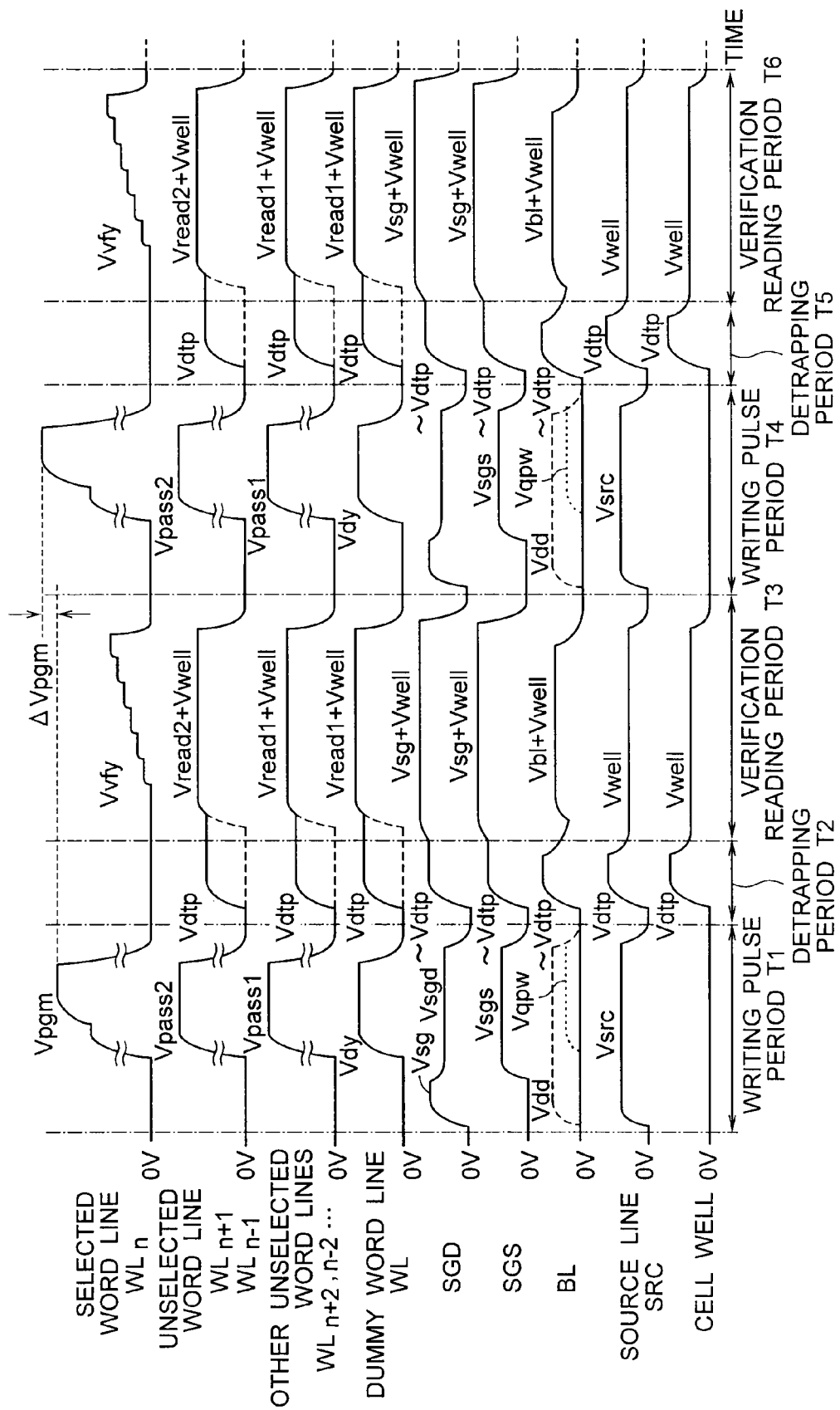
FIG. 7A is a figure showing the voltage waveforms of word lines, a bit line, selector gate lines, a source line, and a cell well during the writing operation of the NAND flash memory 100 according to the third embodiment.

FIG. 7A shows the voltage waveforms of word lines, a bit line, selector gate lines, a source line, and a cell well during the writing operation of the NAND flash memory 100 according to the third embodiment. For simplification, FIG. 7A only shows two repetitions of the application of a writing pulse and verification reading operation in step-up writing voltage scheme.

The writing operation (voltage waveforms) of the third embodiment shown in FIG. 7A is different in verification reading periods T3 and T6 from the writing operation of the second embodiment shown in FIG. 6. Operations (voltage waveforms) in the other periods (T1, T2, T4, and T5) are similar to the operations of the second embodiment.

As shown in FIG. 7A, in the verification reading periods T3 and T6 following the detrapping periods T2 and T5, a source potential control circuit 11 and a well potential control circuit 10 apply a voltage Vwell (1 V to 3 V) to a source line SRC and the cell well. In the present embodiment, the cell well and the source line SRC are set at the same potential as shown in FIG. 7A. The potential of the source line SRC may be set somewhat higher than the potential of the cell well. As has been discussed, the source line SRC is connected to the cell well via an n+ diffusion layer 104 in the cell well and thus it is necessary to avoid the application of a voltage lower than the voltage of the cell well having a forward bias junction.

A control gate potential control circuit 9 and a row decoder 2 apply, to selector gate lines SGS and SGD, a voltage Vsg+Vwell (higher than Vsg by Vwell) for turning on selector gate transistors SGSTr and SGDTr.

The control gate potential control circuit 9 and the row decoder 2 apply a reading voltage Vread2+Vwell (higher than Vread2 by the voltage Vwell) to unselected word lines WLn+1 and WLn−1 adjacent to a selected word line WLn and a reading voltage Vread1+Vwell (higher than Vread1 by Vwell) to the other unselected word lines WLn+2, WLn−2, and so on. Thus memory cells M connected to the unselected word lines are all sufficiently turned on. The selected word line WLn is fed with a verification level Vvfy.

The reading voltage Vread1 and the reading voltage Vread2 are normally set at the same potential. In NAND flash memories having smaller size in the 40-nm or subsequent generations, the reading voltages Vread1 and Vread2 may be different to compensate for a reduction in the current drivability of the adjacent cells. The current drivability is reduced by noticeable capacitive coupling between the selected cell word line and the floating gate of the adjacent cell.

A bit line control circuit 3 applies a voltage Vbl+Vwell (higher than Vbl by Vwell) for reading. A current passing through the memory cell M is then sensed by a sensing circuit included in the bit line control circuit 3, and it is determined whether the threshold value of the memory cell M to be verified is higher or lower than the verification level Vvfy.

In the present embodiment, it is assumed that three bits (octal) are stored in a single memory cell. In this case, the verification level Vvfy is changed seven times to repeat the sensing operation.

In this way, the bit line control circuit 3 senses whether the threshold voltage of the memory cell M connected to the selected word line WLn is higher or lower than the verification level Vvfy, and data corresponding to the sensing result is latched by a latch circuit included in the bit line control circuit 3.

In the present embodiment, the potential is raised to Vwell on the cell well and the cell source line SRC. When a voltage lower than Vwell is applied to the selected word line WLn, the sensing operation can be effectively performed at a negative verification voltage. In other words, a negative threshold voltage can be read.

After that, based on the latched data, a verifying circuit 12 verifies whether the threshold voltages of all the memory cells to be written in a page or whether all the memory cells other than a predetermined permissible number of bits or bytes have reached the verification level or not (whether the memory cells are written enough).

As in the second embodiment, electrons having been captured by the electron traps of a tunnel oxide film are detrapped in the detrapping periods T2 and T5. Thus the number of electrons being trapped when a verification reading operation is performed approaches the number of trapped electrons in a steady state when a normal reading operation is performed.

It is therefore possible to increase the number of memory cells where verification reading operation and normal reading operation can be performed at the same threshold voltage, and reduce the number of memory cells where verification reading operation and normal reading operation are performed at different threshold voltages. In other words, it is possible to reduce the foregoing verification noise caused by verification reading operation and normal reading operation performed at different threshold voltages.

The following will describe the reading operation of the NAND flash memory 100 according to the third embodiment.

Figure 7B:
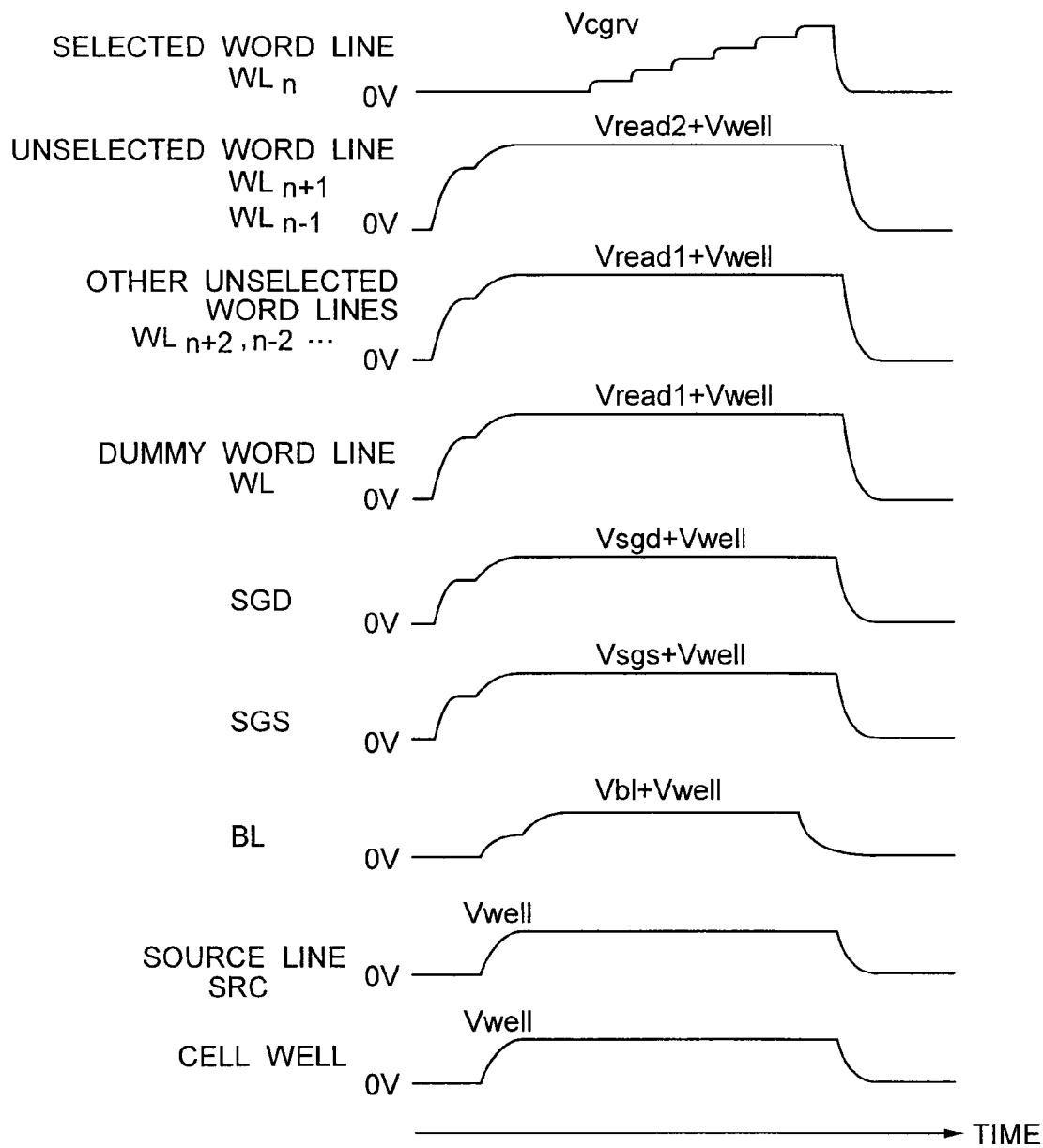
FIG. 7B is a figure showing the voltage waveforms of the word lines, the bit line, the selector gate lines, the source line, and cell well during the reading operation of the NAND flash memory 100 according to the third embodiment.

FIG. 7B shows the voltage waveforms of the word lines, the bit line, the selector gate lines, the source line, and cell well during the reading operation of the NAND flash memory 100 according to the third embodiment.

As shown in FIG. 7B, the waveforms in the reading operation are similar to the waveforms of the verification reading periods T3 and T6 shown in FIG. 7A, and detailed operations performed in the reading operation are similar to detailed operations performed in verification reading. In the present embodiment, the voltage of the selected word line is changed to a reference level Vcgrv sequentially changing in seven steps from the lowest voltage. The reference level Vcgrv may not change from the lowest voltage.

As described above, the control circuits 3, 9, 10, 11 and 7 apply a positive fifth voltage Vwell (1 V to 3 V) lower than a fourth voltage Vdtp to the cell well to read negative threshold voltages during verification reading. Further, as shown in FIG. 7B, the control circuits 3, 9, 10, 11, and 7 apply the fifth voltage Vwell to the cell well during a normal reading operation. In other words, the voltage Vwell applied to the cell well during the normal reading operation is set lower than the voltage Vdtp applied to the cell well in the detrapping periods T2 and T5.

As described above, after the writing pulse is applied, a voltage pulse which has a different polarity from the writing pulse and is set low enough so as not to cause erasure is applied before verification reading.

Thus the number of electrons being trapped when a verification reading is performed can be close to the number of trapped electrons in a steady state when a normal reading operation is performed, so that verification noise is reduced. Therefore, the NAND flash memory of the present embodiment can suppress an increase in the width of the threshold voltage distribution of the memory cell, the width being increased by verification noise.

In a floating-gate NAND flash memory, verification noise is generally caused by electron traps in a tunnel oxide film and thus the electron traps were illustrated in the present embodiment. However, the kind of traps is not limited to electron traps. Also for verification noise caused by hole traps, the present embodiment can achieve the same effect.

Fourth Embodiment

The first to third embodiments particularly described examples of the writing operation and the reading operation of a NAND flash memory.

A fourth embodiment will particularly describe an example of the erasing operation of the NAND flash memory.

Figure 8:
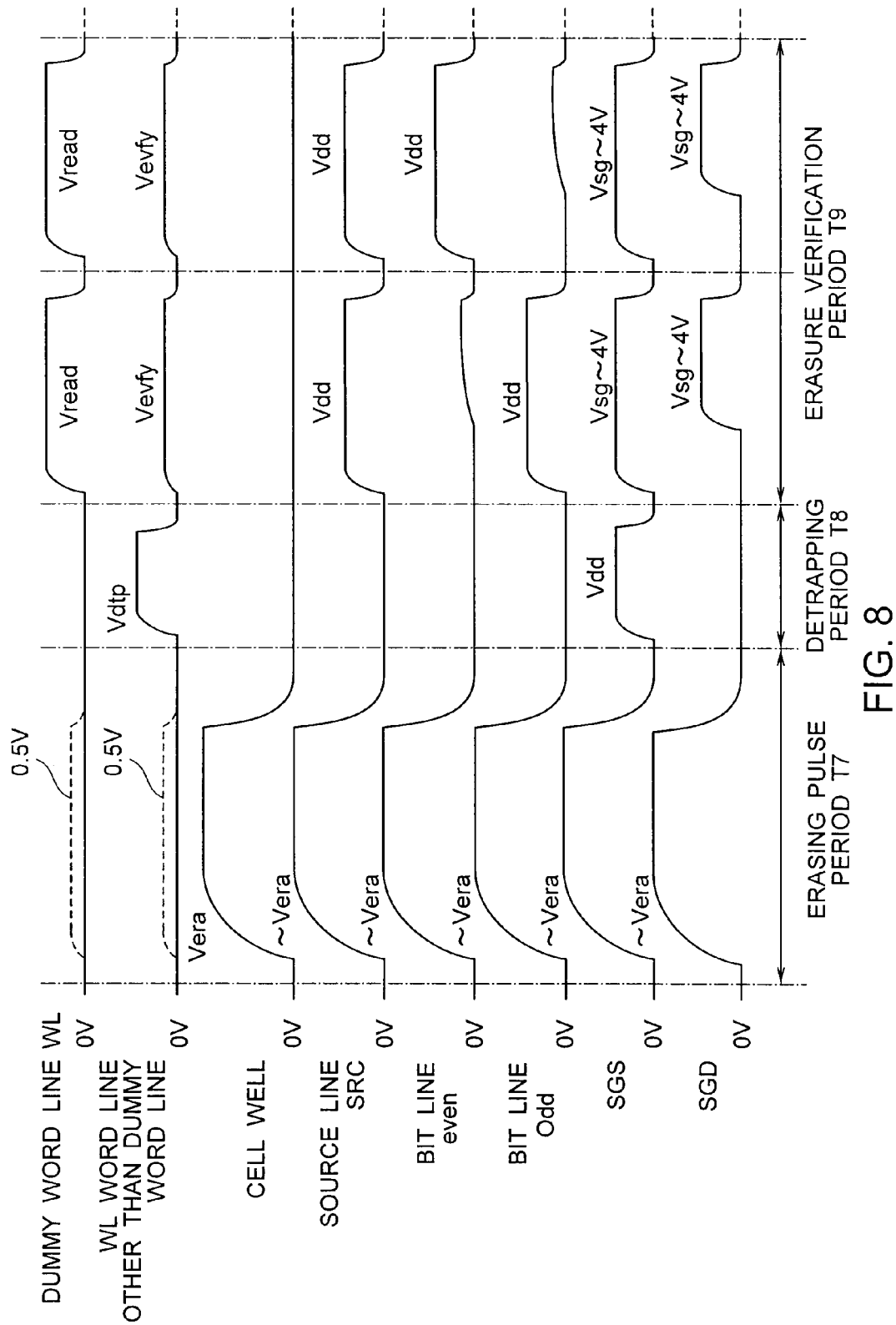
FIG. 8 is a figure showing the voltage waveforms of word lines, bit lines, selector gate lines, a source line, and a cell well during the erasing operation of a NAND flash memory 100 according to the fourth embodiment.

FIG. 8 shows the voltage waveforms of word lines, bit lines, selector gate lines, a source line, and a cell well during the erasing operation of a NAND flash memory 100 according to the fourth embodiment. For simplification, FIG. 8 only shows the waveforms for a single erasing pulse. Further, FIG. 8 only shows the waveforms of the word lines, the selector gate lines, and the source line in a selected block.

As shown in FIG. 8, first, in an erasing pulse period T7, a control gate potential control circuit 9 and a row decoder 2 keep the potentials of a word line WL and a dummy word line WL at 0 V. For example, as indicated by dotted lines, the potentials of the word line WL and the dummy word line WL may be increased to about 0.5 V. Thus it is possible to apply a substrate bias to a turned-off n-channel transistor for transferring a word line voltage in the row decoder 2 of an unselected block, so that the cut-off characteristics can be improved.

As has been discussed, a source line SRC and bit lines BL are connected to the cell well via an n+ diffusion layer. When a well potential control circuit 10 charges the cell well to a voltage Vera, the source line SRC and the bit lines BL are charged through the junction between the p-type cell well and the n-type diffusion layer and the potential is increased to around the voltage Vera.

In the erasing pulse period T7, in order to prevent a high voltage from causing a breakdown in the gate oxide films of selector gate transistors SGSTr and SGDTr, the control gate potential control circuit 9 and the row decoder 2 bring selector gate lines SGS and SGD into a floating state. Thus the potentials of the selector gate lines SGS and SGD are increased to around the voltage Vera by capacitive coupling with the cell well, the source line SRC, and the bit lines BL.

The erasing voltage Vera, which is a negative high voltage, is applied thus between the word lines WL (control gates CG) and the well, so that a Fowler-Nordheim tunnel current is generated and electrons are drawn from floating gates FG to the cell well. Thus the threshold voltage of a memory cell M connected to the word line and the dummy word line decreases (that is, the memory cell is erased).

In other words, the control circuits 3, 9, 10, 11, and 7 draw charge from the floating gates FG by applying the erasing voltage Vera between the control gates CG and the well during an erasing operation. The erasing operation is normally performed for each block, that is, simultaneously on the memory cells M connected to all the word lines existing in a NAND string.

Next, in a detrapping period T8, charge having been captured by charge traps in a tunnel oxide film is drawn by applying the detrapping voltage Vdtp.

The source potential control circuit 11 and the well potential control circuit 10 keep the source line SRC and the cell well at 0 V. The bit line control circuit 3 keeps the potentials of the bit lines BL at 0 V.

Further, the control gate potential control circuit 9 and the row decoder 2 apply 0 V to the selector gate line SGD on the drain side and apply a voltage Vdd to the selector gate line SGS on the source side, which turns on the selector gate transistor SGSTr. Thus 0V is transferred from the source line to the channel of the NAND string. In the present embodiment, SGSTr is turned on to transfer 0 V from the source line. In reverse, SGDTr may be turned on to transfer 0 V from the bit line.

In this state, the control gate potential control circuit 9 and the row decoder 2 apply a voltage Vdtp (e.g., 3 V to 8 V) to the word lines WL other than the dummy word lines WL. In the present embodiment, the voltage Vdtp is not applied to the dummy word lines but the dummy word lines may be fed with the voltage Vdtp as the other word lines.

In other words, the control circuits 3, 9, 10, 11, and 7 apply the detrapping voltage Vdtp between the control gates CG and the cell well before erasure verification reading operation. The detrapping voltage Vdtp has a reversed polarity from the erasing voltage Vera and has an absolute value smaller than the absolute value of a writing voltage.

Thus by the detrapping voltage vdtp, it is possible to accelerate detrapping of charge having been captured by electron traps or hole traps in the tunnel oxide film (an oxide film or a nitride oxide film provided between the cell well and the floating gate FG). In other words, the number of charges being trapped when erasure verification reading operation is performed (the subsequent verification reading period T9) can be close to the number of trapped charges in a steady state when a normal reading operation is performed.

In order to prevent the floating gates FG from being charged, the absolute value of the detrapping voltage Vdtp is set smaller than the absolute value of the writing voltage applied between the control gates CG and the cell well during writing operation.

Next, in the verification reading period T9, erasure verification reading operation is performed to confirm whether erasure of the memory cells is performed to a desired threshold value and below. In the present embodiment, erasure verification reading operation is performed twice respectively on the memory cells connected to the even bit lines BL and the memory cells connected to the odd bit lines BL.

The well potential control circuit 10 keeps the cell well at 0 V during the verification reading period T9.

First, the bit line control circuit 3 applies 0 V to the even bit lines BL to which erasure verification is performed, and applies the voltage Vdd (e.g., 2 V to 3 V) to the odd bit lines BL to which erasure verification in not performed. The odd bit lines act as shield lines when erasure verification reading operation is performed on the even bit lines.

Moreover, the source potential control circuit 11 applies the power supply voltage Vdd to the source line SRC, and the control gate potential control circuit 9 and the row decoder 2 apply a voltage Vsg (e.g., 4 V to 5 V) to the source-side selector gate line SGS. Thus the selector gate transistor SGSTr is turned on and the voltage Vdd is transferred from the source line to the NAND string.

The control gate potential control circuit 9 and the row decoder 2 apply a reading voltage Vread (3 V to 6 V) to the dummy word lines WL. Thus the memory cells M having the gates connected to the dummy word lines WL are sufficiently turned on.

The control gate potential control circuit 9 and the row decoder 2 apply an erasure verification voltage Vevfy to the word lines other than the dummy word lines WL.

Next, the even bit lines BL to which erasure verification is performed are brought into a floating state by the bit line control circuit 3, and the voltage Vsg is applied to the selector gate line SGD on the drain side by the control gate potential control circuit 9 and the row decoder 2. Thus the selector gate transistor SGDTr is turned on and the even bit lines BL to which erasure verification is performed are charged to voltages corresponding to the threshold voltages of the memory cells in the NAND string.

The charged levels of the even bit lines are sensed by a sensing circuit included in the bit line control circuit 3, and it is determined whether the memory cells to which erasure verification is performed are sufficiently erased or not (whether the memory cells have threshold voltages at a desired voltage or below).

After that, erasure verification is performed on the odd bit lines. The operation waveforms of other signals are similar to the operation waveforms of erasure verification on the even bit lines except that operations on the even bit lines and the odd bit lines are reversed from each other.

In this way, the potentials of the bit lines BL depend upon whether the threshold voltages of the memory cells M in a block to be erased are higher or lower than the erasure verification voltage Vevfy, and the potentials are sensed by the bit line control circuit 3. Data corresponding to the sensing result is latched by the bit line control circuit 3.

After that, based on the latched data, a verifying circuit 12 verifies whether or not erasure is performed enough on all the memory cells to be erased in a page or all the memory cells other than a predetermined permissible number of bits or bytes, that is, whether erasure verification is passed.

As described above, in the detrapping period T8, charge having been captured by electron traps or hole traps in the tunnel oxide film is detrapped. Thus the number of charges being captured by the traps when erasure verification reading operation is performed approaches the number of trapped charges in a steady state when a normal reading operation is performed. It is therefore possible to increase the number of memory cells where erasure verification reading operation and normal reading operation can be performed at the same threshold voltage, and reduce the number of memory cells where erasure verification reading operation and normal reading operation are performed at different threshold voltages. In other words, it is possible to reduce the foregoing verification noise caused by erasure verification reading operation and normal reading operation performed at different threshold voltages.

Thereafter, when the verifying circuit 12 does not determine that erasure verification is passed, the erasing voltage Vera is increased by ΔVera (e.g., 1 V) and operations as in periods T7 to T9 are repeated. When erasure verification is not passed after a predetermined number of repetitions, erasure is regarded as being no good and the erasing operation is completed.

When erasure verification is passed, the erasure is regarded as being passed and the erasing operation on the corresponding page or block is completed.

As described above, after an erasing pulse is applied, the voltage pulse which has a different polarity from the erasing pulse and is set low enough so as not to cause writing is applied before verification reading operation.

Thus it is possible to equalize the number of traps during verification reading and a normal reading operation, so that verification noise is reduced. It is therefore possible to suppress an increase in the width of the threshold voltage distribution of the memory cell.

As described above, according to the NAND flash memory of the present embodiment, after the erasing pulse is applied, the voltage pulse which has a different polarity from the erasing pulse and is set low enough so as not to cause writing is applied before erasure verification reading operation.

Thus the number of charges being trapped when erasure verification reading operation is performed can be close to the number of trapped charges in a steady state when a normal reading operation is performed, so that verification noise is reduced. It is therefore possible to suppress an increase in the width of the threshold voltage distribution of the memory cell, the width being increased by verification noise.

What is claimed is:

1. A NAND flash memory, comprising:
   a NAND string made up of a plurality of memory cells connected in series to store information according to a threshold voltage corresponding to an amount of charge retained in a charge retaining layer, the memory cell including: the charge retaining layer which is formed on a well in a surface of a semiconductor substrate via a first insulating film and is isolated from a surrounding part by a plurality of insulating films including the first insulating film and a second insulating film; and a control gate provided on the charge retaining layer via the second insulating film, and
   a control circuit that controls operations of the memory cells by controlling voltages applied to the control gates and the well,
   wherein the control circuit injects charge into the charge retaining layer or removes charge from the charge retaining layer by applying a writing voltage between the control gate and the well during a writing operation, and then
   the control circuit releases charge having been trapped in the first insulating film provided between the well and the charge retaining layer, by applying a detrapping voltage between the control gate and the well before a verification reading operation, the detrapping voltage having a reversed polarity from the writing voltage and an absolute value smaller than an absolute value of the writing voltage, and
   wherein the well is a p-type semiconductor,
   the control circuit applies the writing voltage between the control gate of a selected memory cell in a selected NAND string and the well by applying a first voltage to the well and a positive second voltage higher than the first voltage to the control gate of the selected memory cell in the selected NAND string during the writing operation, and then
   the control circuit applies the detrapping voltage between the control gate of the selected memory cell in the selected NAND string and the well by applying a third voltage to the well and a negative fourth voltage lower than the third voltage to the control gate of the selected memory cell in the selected NAND string, and raises a potential of a control gate of an unselected memory cell in the selected NAND string close to the third voltage before the verification reading operation.

2. A NAND flash memory, comprising:
   a NAND string made up of a plurality of memory cells connected in series to store information according to a threshold voltage corresponding to an amount of charge retained in a charge retaining layer, the memory cell including: the charge retaining layer which is formed on a well in a surface of a semiconductor substrate via a first insulating film and is isolated from a surrounding part by a plurality of insulating films including the first insulating film and a second insulating film; and a control gate provided on the charge retaining layer via the second insulating film, and
   a control circuit that controls operations of the memory cells by controlling voltages applied to the control gates and the well,
   wherein the control circuit injects charge into the charge retaining layer or removes charge from the charge retaining layer by applying a writing voltage between the control gate and the well during a writing operation, and then
   the control circuit releases charge having been trapped in the first insulating film provided between the well and the charge retaining layer, by applying a detrapping voltage between the control gate and the well before verification reading operation, the detrapping voltage having a reversed polarity from the writing voltage and an absolute value smaller than an absolute value of the writing voltage, and
   wherein the well is a p-type semiconductor,
   the control circuit applies the writing voltage between the control gate of a selected memory cell in a selected NAND string and the well by applying a first voltage to the well and a positive second voltage higher than the first voltage to the control gate of the selected memory cell in the selected NAND string during the writing operation, and then
   the control circuit applies the detrapping voltage between the control gate of the selected memory cell in the selected NAND string and the well by applying a third voltage to the control gate of the selected memory cell in the selected NAND string and a positive fourth voltage higher than the third voltage to the well, and raises a potential of a control gate of an unselected memory cell in the selected NAND string close to the fourth voltage before the verification reading operation.

3. The NAND flash memory according to claim 1, wherein the detrapping voltage has an absolute value smaller than an absolute value of an erasing voltage applied between the control gate and the well during an erasing operation.

4. The NAND flash memory according to claim 1, wherein the control circuit applies the detrapping voltage between the control gate of the selected memory cell in the selected NAND string and the well before the verification reading operation such that an amount of charge being trapped in the first insulating film when the verification reading operation is performed approaches an amount of charge being trapped in the first insulating film when a normal reading operation is performed.

5. The NAND flash memory according to claim 2, wherein the control circuit applies a positive fifth voltage lower than the fourth voltage to the well during the verification reading operation, and
   the control circuit applies the fifth voltage to the well during a normal reading operation.

6. The NAND flash memory according to claim 5, wherein the detrapping voltage has an absolute value smaller than an absolute value of an erasing voltage applied between the control gate and the well during an erasing operation.

7. The NAND flash memory according to claim 5, wherein the control circuit applies the detrapping voltage between the control gate of the selected memory cell in the selected NAND string and the well before the verification reading operation such that an amount of charge being trapped in the first insulating film when the verification reading operation is performed approaches an amount of charge being trapped in the first insulating film when a normal reading operation is performed.

8. The NAND flash memory according to claim 2, wherein the detrapping voltage has an absolute value smaller than an absolute value of an erasing voltage applied between the control gate and the well during an erasing operation.

9. The NAND flash memory according to claim 2, wherein the control circuit applies the detrapping voltage between the control gate of the selected memory cell in the selected NAND string and the well before the verification reading operation such that an amount of charge being trapped in the first insulating film when the verification reading operation is performed approaches an amount of charge being trapped in the first insulating film when a normal reading operation is performed.

10. A NAND flash memory, comprising:
a NAND string made up of a plurality of memory cells connected in series to store information according to a threshold voltage corresponding to an amount of charge retained in a charge retaining layer, the memory cell including: the charge retaining layer which is formed on a well in a surface of a semiconductor substrate via a first insulating film and is isolated from a surrounding part by a plurality of insulating films including the first insulating film and a second insulating film; and a control gate provided on the charge retaining layer via the second insulating film, and
a control circuit that controls operations of the memory cells by controlling voltages applied to the control gates and the well,
wherein the control circuit injects charge into the charge retaining layer or removes charge removed from the charge retaining layer by applying an erasing voltage between the control gate and the well during an erasing operation, and then the control circuit releases charge having been trapped in the first insulating film provided between the well and the charge retaining layer, by applying a detrapping voltage between the control gate and the well before the verification reading, the detrapping voltage having a reversed polarity from the erasing voltage and an absolute value smaller than an absolute value of the erasing voltage.

11. The NAND flash memory according to claim 10, wherein the absolute value of the detrapping voltage is lower than the absolute value of a writing voltage applied between the control gate and the well during a writing operation.

12. The NAND flash memory according to claim 10, wherein the control circuit applies the detrapping voltage between the control gate and the well before the verification reading operation such that an amount of charge being trapped in the first insulating film when the verification reading operation is performed approaches an amount of charge being trapped in the first insulating film when a normal reading operation is performed.

13. The NAND flash memory according to claim 11, wherein the control circuit applies the detrapping voltage between the control gate and the well before the verification reading operation such that an amount of charge being trapped in the first insulating film when the verification reading operation is performed approaches an amount of charge being trapped in the first insulating film when a normal reading operation is performed.

* * * * *